(12) United States Patent
Sadovnikov et al.

(10) Patent No.: US 11,791,405 B2
(45) Date of Patent: Oct. 17, 2023

(54) TRANSISTOR HAVING AN EMITTER REGION WITH A SILICIDE SPACED APART FROM A BASE CONTACT

(71) Applicant: TEXAS INSTRUMENTS INCORPORATED, Dallas, TX (US)

(72) Inventors: Alexei Sadovnikov, Sunnyvale, CA (US); Natalia Lavrovskaya, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/375,598

(22) Filed: Jul. 14, 2021

(65) Prior Publication Data

US 2021/0343860 A1 Nov. 4, 2021

Related U.S. Application Data (62) Division of application No. 15/859,292, filed on Dec. 29, 2017, now Pat. No. 11,094,806.

(51) Int. Cl.
| | | |
|---|---|---|
| H01L 29/739 | (2006.01) | |
| H01L 29/66 | (2006.01) | |
| H01L 21/265 | (2006.01) | |
| H01L 21/768 | (2006.01) | |
| H01L 29/45 | (2006.01) | |
| H01L 21/02 | (2006.01) | |
| H01L 29/49 | (2006.01) | |
| H01L 21/311 | (2006.01) | |
| H01L 29/08 | (2006.01) | |
| H01L 21/324 | (2006.01) | |

(52) U.S. Cl.
CPC .... *H01L 29/7393* (2013.01); *H01L 21/02164* (2013.01); *H01L 21/26513* (2013.01); *H01L 21/31105* (2013.01); *H01L 21/324* (2013.01); *H01L 21/76889* (2013.01); *H01L 29/0808* (2013.01); *H01L 29/45* (2013.01); *H01L 29/4916* (2013.01); *H01L 29/66325* (2013.01)

(58) Field of Classification Search
CPC ........... H01L 29/7393; H01L 29/66325; H01L 29/735; H01L 21/76889; H01L 29/0804; H01L 29/0808; H01L 29/0821; H01L 29/1004; H01L 29/45; H01L 29/4916; H01L 29/42304; H01L 29/66272; H01L 29/732
USPC ....................................................... 257/139
See application file for complete search history.

(56) References Cited

U.S. PATENT DOCUMENTS

| | | |
|---|---|---|
| 4,118,250 A | 10/1978 | Horng et al. |
| 4,160,991 A | 7/1979 | Anantha et al. |
| 4,507,848 A | 4/1985 | Smith |
| 4,559,696 A | 12/1985 | Anand et al. |
| 4,868,631 A | 9/1989 | Hollingsworth et al. |
| 5,045,916 A | 9/1991 | Vor et al. |

(Continued)

*Primary Examiner* — Khiem D Nguyen
(74) *Attorney, Agent, or Firm* — Andrew R. Ralston; Frank D. Cimino (57) ABSTRACT

An integrated circuit includes a transistor that has an collector region, a base region laterally surrounded by the collector region, and an emitter region laterally surrounded by the base region. A silicide layer on the emitter region is laterally spaced apart from the base region by an unsilicided ring. The emitter region is laterally spaced apart from a base contact region that may be covered by a dielectric layer such as a gate oxide layer.

19 Claims, 5 Drawing Sheets

(56) References Cited

U.S. PATENT DOCUMENTS

| | | |
|---|---|---|
| 5,100,824 A | 3/1992 | Vora |
| 5,338,694 A | 8/1994 | Ilderem et al. |
| 5,369,042 A | 11/1994 | Morris et al. |
| 5,436,496 A * | 7/1995 | Jerome ............... H01L 27/1026 |
| | | 257/E23.149 |
| 5,441,903 A | 8/1995 | Eklund |
| 5,661,046 A | 8/1997 | Ilderem et al. |
| 6,395,609 B1 * | 5/2002 | Yu ....................... H01L 29/7311 |
| | | 438/335 |
| 6,489,665 B2 | 12/2002 | Prall et al. |
| 6,989,557 B2 | 1/2006 | Chen et al. |
| 7,335,947 B2 * | 2/2008 | Francis ............... H01L 29/7813 |
| | | 257/334 |
| 7,846,805 B2 | 12/2010 | Zhang et al. |
| 8,823,051 B2 * | 9/2014 | Cai ...................... H01L 29/7391 |
| | | 257/E29.256 |
| 9,041,096 B2 | 5/2015 | Nakajima |
| 9,461,046 B1 | 10/2016 | Edwards et al. |
| 2005/0202664 A1 | 9/2005 | Jawarani |
| 2007/0207585 A1 | 9/2007 | El-Kareh et al. |
| 2008/0217690 A1 | 9/2008 | Mandelman et al. |
| 2009/0108346 A1 | 4/2009 | Cai |
| 2010/0213507 A1 * | 8/2010 | Ko ....................... H01L 29/6625 |
| | | 257/141 |
| 2010/0252860 A1 * | 10/2010 | Yang .................... H01L 29/735 |
| | | 257/E29.187 |
| 2011/0049678 A1 * | 3/2011 | Benaissa ........... H01L 29/66325 |
| | | 257/E29.174 |
| 2012/0091471 A1 * | 4/2012 | Ellison .............. H01L 21/02529 |
| | | 257/77 |
| 2013/0228868 A1 | 9/2013 | Stribley |
| 2014/0225126 A1 | 8/2014 | Aketa et al. |
| 2015/0364584 A1 * | 12/2015 | Ryu .................... H01L 29/7395 |
| | | 438/138 |
| 2015/0371985 A1 * | 12/2015 | Edwards ............. H01L 27/0262 |
| | | 438/134 |
| 2016/0027905 A1 * | 1/2016 | Singh ................ H01L 29/66325 |
| | | 438/135 |
| 2016/0155796 A1 * | 6/2016 | Basler .................. H01L 29/456 |
| | | 257/629 |
| 2016/0260829 A1 | 9/2016 | Aichinger et al. |
| 2017/0148873 A1 | 5/2017 | Kim et al. |
| 2017/0323970 A1 * | 11/2017 | Dolny ................ H01L 29/7839 |

* cited by examiner

FIG. 6 ial of U.S. patent application Ser. No. 15/859,292, filed Dec. 29, 2017, and references U.S. patent application Ser. No. 15/824,665, which was filed Nov. 28, 2017, issued as U.S. Pat. No. 11,094,806, and titled "FABRICATING TRANSISTORS WITH A DIELECTRIC FORMED ON A SIDEWALL OF A GATE MATERIAL AND A GATE OXIDE BEFORE FORMING SILICIDE," both of which are hereby incorporated herein by reference in their entireties.

BACKGROUND

Bipolar junction transistors are often used in many high performance analog applications to amplify or buffer analog signals. In such applications, it is desirable for bipolar junction transistors to exhibit a relatively high transistor beta, β, and in particular, a relatively high beta Early voltage product, $\beta V_A$. It is also desirable for bipolar junction transistors to exhibit relatively low 1/f noise and popcorn noise, and yet have a relatively high beta or a relatively high beta Early voltage product.

SUMMARY

In accordance with a first set of embodiments, a method to fabricate a transistor, the method comprising: implanting dopants in a semiconductor to form a collector region having majority carriers of a first type; implanting dopants with a first dosage and implanting dopants with a second dosage in the collector region to form a base region having majority carriers of a second type, wherein the second dosage is at a lower energy than the first dosage; forming a gate oxide on the base region; forming a gate material on the gate oxide; forming the gate material and the gate oxide to leave uncovered an emitter area of the base region; and implanting dopants in the emitter area to form an emitter region having majority carriers of the first type.

In accordance with the first set of embodiments, the method further comprises: forming a dielectric to cover a first area of the emitter region and a first sidewall of the gate material and the gate oxide, and to leave uncovered a second area of the emitter region; depositing a metal over the dielectric and the second area of the emitter region; and annealing the semiconductor to form silicide in the second area of the emitter region, wherein forming the dielectric to cover the first area of the emitter region and the first sidewall of the gate material and the gate oxide is performed before annealing the semiconductor to form silicide.

In accordance with the first set of embodiments, the method further comprises: forming the gate material and the gate oxide to leave uncovered a base contact drain area of the base region; and implanting dopants in the base contact area of the base region to form a base contact region having majority carriers of the second type.

In accordance with the first set of embodiments, the method further comprises: forming the dielectric to cover a first area of the base contact region and a second sidewall of the gate material and the gate oxide, and to leave uncovered a second area of the base contact region; depositing the metal over the second area of the base contact region; and when annealing the semiconductor, forming silicide in the second area of the base contact region, wherein forming the dielectric to cover the first area of the base contact region and the second sidewall of the gate material and the gate oxide is performed before annealing the semiconductor to form silicide.

In accordance with the first set of embodiments, in the method, the dielectric comprises silicon dioxide.

In accordance with the first set of embodiments, in the method, the gate material comprises polysilicon.

In accordance with the first set of embodiments, in the method, the metal comprises tungsten.

In accordance with the first set of embodiments, the method further comprises removing the metal that has not formed the silicide.

In accordance with the first set of embodiments, in the method, the majority carriers of the first type are holes and the majority carriers of the second type are electrons.

In accordance with the first set of embodiments, the method further comprises: implanting dopants in the collector region to form a well having majority carriers of the first type; implanting dopants in the well to form a collector contact region having majority carriers of the first type; depositing the metal over the collector contact region; and when annealing the semiconductor, forming silicide in the collector contact region.

In accordance with a second set of embodiments, a method to fabricate a transistor, the method comprising: implanting dopants in a semiconductor to form a collector region having majority carriers of a first type; implanting dopants with a first dosage and implanting dopants with a second dosage in the collector region to form a base region having majority carriers of a second type, wherein the second dosage is at a lower energy than the first dosage; growing a gate oxide on the semiconductor; depositing a gate material on the gate oxide; etching the gate material and the gate oxide to expose an emitter area of the base region surrounded by a first sidewall of the gate material and the gate oxide, and to expose a base contact area of the base region, the base contact area surrounding a second sidewall of the gate material and the gate oxide; implanting dopants in the emitter area to form an emitter region having majority carriers of the first type; implanting dopants in the base contact area of the base region to form a base contact region having majority carriers of the second type; depositing a dielectric over the semiconductor; etching the dielectric to cover the first sidewall of the gate material and the gate oxide, the dielectric after etching exposing a portion of the semiconductor; depositing metal over the dielectric and the exposed portion of the semiconductor; and annealing the semiconductor to form silicide in the exposed portion of the semiconductor.

In accordance with the second set of embodiments, the method further comprises etching the dielectric to cover the second sidewall of the gate material and the gate oxide.

In accordance with the second set of embodiments, in the method, the dielectric comprises silicon dioxide, the method further comprising removing the metal from the dielectric.

In accordance with the second set of embodiments, in the method, the majority carriers of the first type are holes and the majority carriers of the second type are electrons.

In accordance with a third set of embodiments, a transistor comprises: a collector region having majority carriers of a first type; a base region having majority carriers of a second type, the base region having a dopant concentration greater than $1.0*10^{16}$ cm$^{-3}$ at a depth of 0.2 microns; an emitter region having majority carriers of the first type, the emitter region having a first area and a second area; silicide, wherein the silicide is formed in the second area of the emitter region; a gate oxide over the base region; and a gate material on the gate oxide, the gate material and the gate oxide having a first sidewall, wherein the silicide formed in the second area of the emitter region is separated from the first sidewall by a distance of at least 0.1 microns.

In accordance with the third set of embodiments, in the transistor, the first area of the emitter region surrounds the second area of the emitter region, and the first sidewall surrounds the first area of the emitter region.

In accordance with a third set of embodiments, the transistor further comprises: a base contact region in the base region having majority carriers of the second type; wherein the base contact region has a first area and a second area; and wherein the silicide is formed in the second area of the base contact region.

In accordance with the third set of embodiments, in the transistor, the gate material and the gate oxide have a second sidewall, the second area of the base contact region surrounds the first area of the base contact region, and the first area of the base contact region surrounds the second sidewall.

In accordance with a third set of embodiments, the transistor further comprises a silicide block formed on the first sidewall and on the first area of the emitter region.

In accordance with the third set of embodiments, in the transistor, the majority carriers of the first type are holes and the majority carriers of the second type are electrons.

BRIEF DESCRIPTION OF THE DRAWINGS

For a detailed description of various examples, reference will now be made to the accompanying drawings in which.

DETAILED DESCRIPTION

In many high performance analog applications, a bipolar junction transistor (BJT) is often used to amplify, buffer, or condition an analog signal. In such applications, it is desirable for a transistor to have a relatively high beta Early voltage product, with relatively low 1/f noise and popcorn noise. In current fabrication process technology, it can be difficult to achieve both of these design objectives. A silicide block separating the emitter contact from the base contact in a transistor can be used to maintain a relatively high beta, but this design does not mitigate the noise. To mitigate the noise, a gate oxide, protected by a polysilicon gate, can be disposed between the emitter contact and the base contact, but in current fabrication process technology the polysilicon gate defines the emitter contact area and the base contact area, so that silicide formation on these areas may lead to a relatively low beta. It is desirable for a fabrication process and transistor design to maintain a relatively high beta Early voltage product with relatively low 1/f noise and popcorn noise.

In accordance with the disclosed embodiments, a transistor is fabricated in which a first implantation of dopants is performed to form a base region, followed by a second implantation of dopants into the base region. The first implantation of dopants provides a relatively deep implantation to form the base region. The second implantation of dopants provides a relatively shallow implantation. The second implantation of dopants increases the dopant concentration at a surface between an emitter region and a base contact region.

In accordance with the disclosed embodiments, in addition to fabricating the transistor with the first and second implantation of donors, the transistor comprises a gate material on a gate oxide, disposed between an emitter region and a base contact region, where a dielectric is formed on a first sidewall of the gate material and the gate oxide before forming silicide. The dielectric formed on the first sidewall serves as a silicide block, preventing silicide from forming on the first sidewall, so that the silicide does not form on the entire area of the emitter region and is at a distance from the first sidewall. In some embodiments, the silicide formed on the emitter region is separated from the first sidewall by a distance of 0.1 microns to 1 microns. As discussed below, the silicide block on the first sidewall helps reduce 1/f noise and popcorn noise while maintaining a relatively high transistor beta. In accordance with the disclosed embodiments, the dielectric is formed on a second sidewall of the gate material and the gate oxide before forming silicide.

Figure 1:
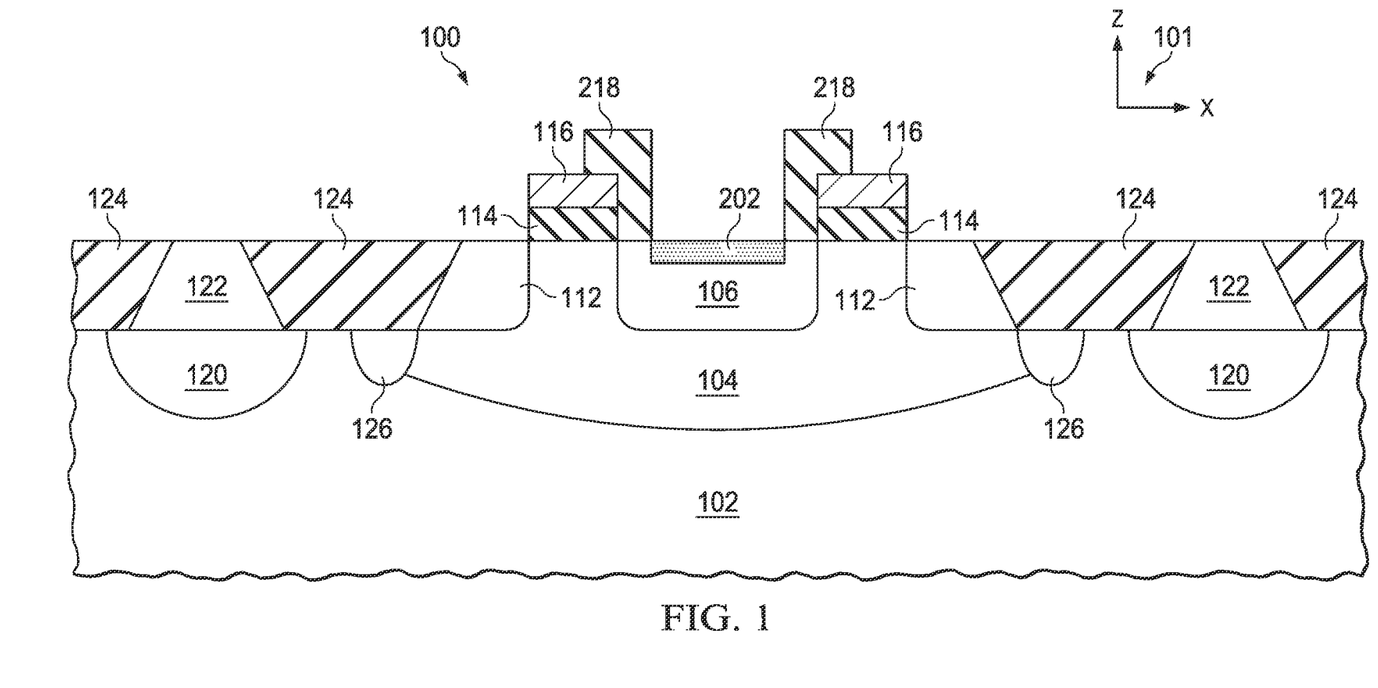
FIG. 1 shows an illustrative transistor in accordance with various examples.

FIG. 1 shows an illustrative transistor 100 according to an embodiment. The illustrative transistor 100 is a bipolar junction transistor (BJT), and includes a collector region 102, a base region 104, and an emitter region 106. In some embodiments, the illustrative transistor 100 is a PNP transistor, where the collector region 102 and the emitter region 106 are P-type semiconductors, and the base region 104 is an N-type semiconductor. For a PNP transistor, the collector region 102 and the emitter region 106 can be fabricated by implanting acceptor dopants into a silicon semiconductor, and the base region 104 can be fabricated by implanting donor dopants into a silicon semiconductor.

In some embodiments, the illustrative transistor 100 is an NPN transistor, where the collector region 102 and the emitter region 106 are N-type semiconductors, and the base region 104 is a P-type semiconductor. For an NPN transistor, the collector region 102 and the emitter region 106 can be fabricated by implanting donor dopants into a silicon semiconductor, and the base region 104 can be fabricated by implanting acceptor dopants into a silicon semiconductor.

More generally, the collector region 102 and the emitter region 106 may be described as having majority carriers of a first type, and the base region 104 may be described as having majority carriers of a second type. For some embodiments, holes can be the first type of majority carriers and electrons can be the second type of majority carriers.

FIG. 1 presents a cross-sectional slice of the illustrative transistor 100, and is not drawn to scale. FIG. 1 does not show various vias and metal layers that are fabricated in a back-end-of-line (BEOL) process to connect the illustrative transistor 100 to other devices (not shown) to form a circuit.

FIG. 1 does not show the semiconductor substrate that the collector region 102 is formed in, nor does FIG. 1 show the semiconductor substrate as part of a wafer in which other devices may be integrated with the illustrative transistor 100. The collector region 102 may be fabricated within a well formed in the semiconductor substrate, and there may be shallow trench isolation (STI) regions to isolate the illustrative transistor 100 from other devices (not shown). The semiconductor material upon which the illustrative transistor 100 is fabricated may be obtained from crystalline silicon grown from a seed, or the semiconductor material may also include epitaxial layers grown upon a semiconductor substrate.

Figure 2:
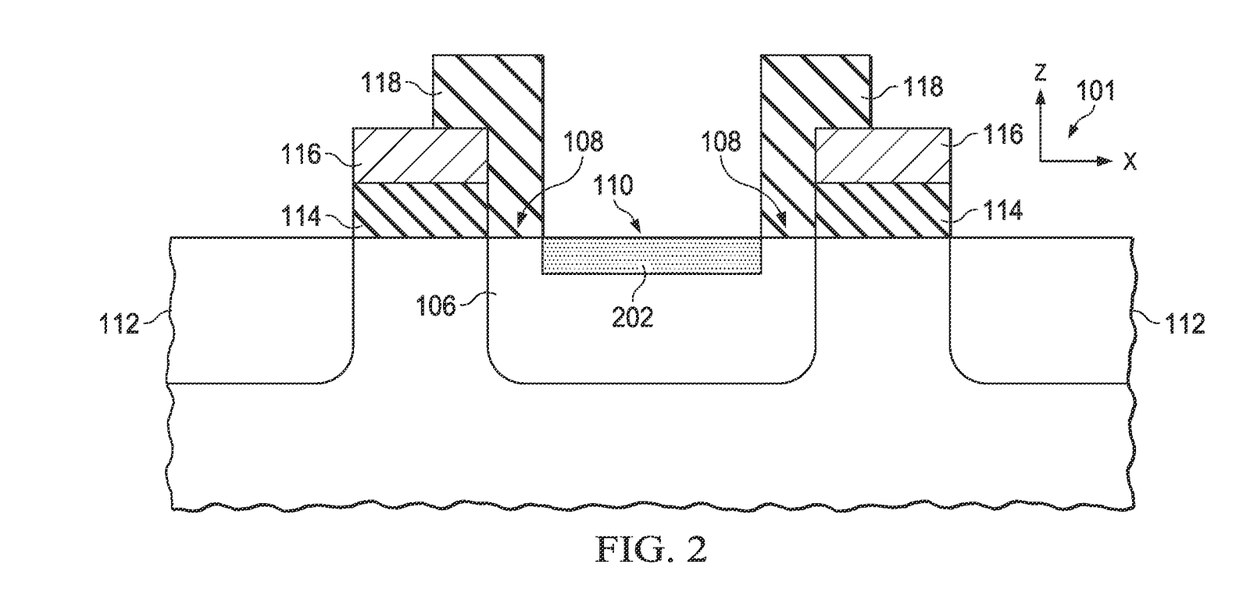
FIG. 2 shows an illustrative transistor in accordance with various examples.
Figure 3:
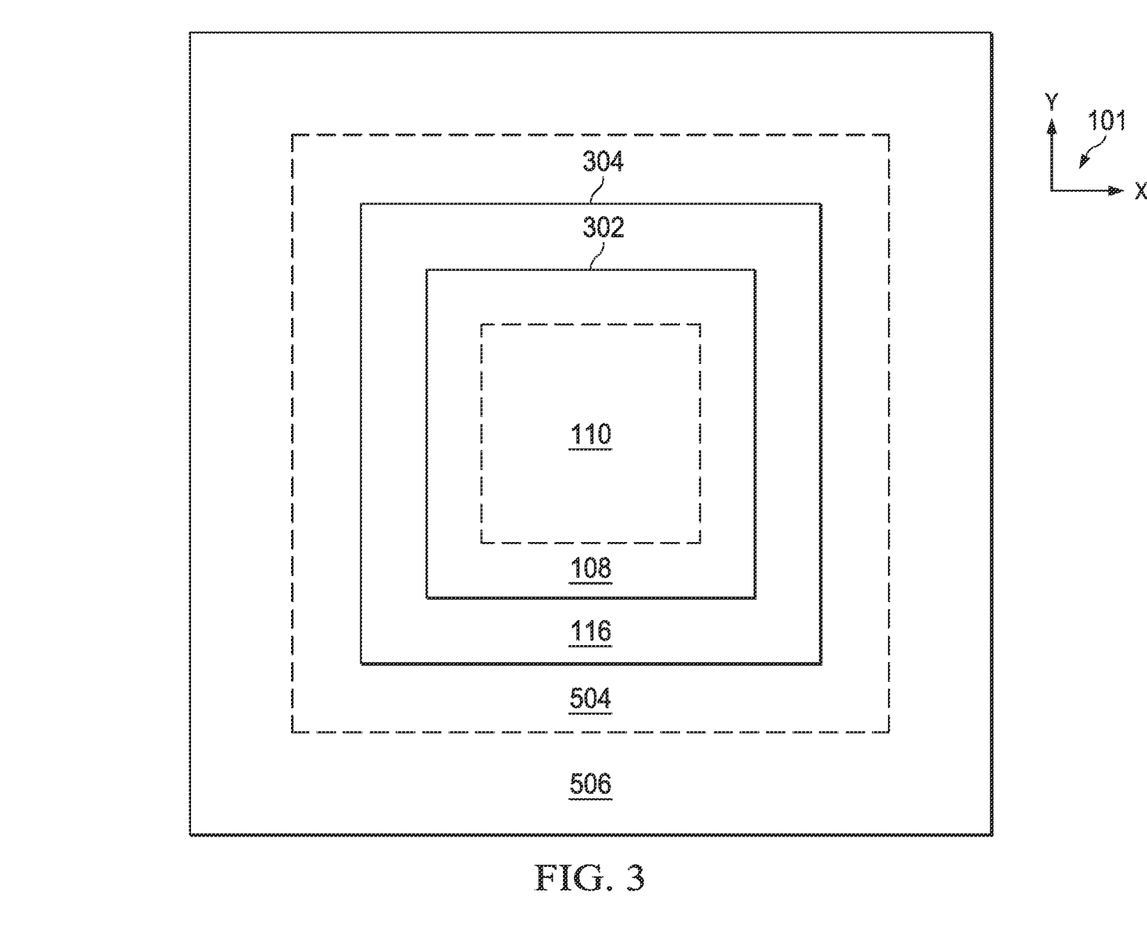
FIG. 3 shows an illustrative transistor in accordance with various examples.

FIG. 2 shows the illustrative transistor 100 according to an embodiment, where several of the components in FIG. 1 are shown in more detail. FIG. 3 shows the illustrative transistor 100 according to an embodiment, where several of the components in FIG. 1 are shown in more detail, but with respect to a different orientation of view.

A coordinate system 101 shown in FIG. 1, FIG. 2, and FIG. 3, shows the relationship among the orientations of views depicted in these figures. In FIG. 1, the coordinate system 101 has its x-axis and z-axis in the page of the drawing, where the y-axis (not shown) points into the page of the drawing. In this orientation, the x-y plane of the coordinate system 101 is parallel to the surface of the semiconductor upon which the illustrative transistor 100 is fabricated.

In FIG. 2, the coordinate system 101 has the same orientation as shown in FIG. 1. In FIG. 3, the coordinate system 101 has its x-axis and y-axis lying in the page of the drawing, where the z-axis (not shown) points out of the page of the drawing. The x-y plane of the coordinate system 101 as shown in FIG. 3 is still parallel to the surface of the semiconductor upon which the illustrative transistor 100 is fabricated, but the orientation of view depicted in FIG. 3 may be described as looking down upon the illustrative transistor 100. As for FIG. 1, FIG. 2 and FIG. 3 do not show all components of the illustrative transistor 100 that are fabricated for an operational circuit, and these figures are not drawn to scale.

Referring to FIG. 2, the emitter region 106 has a first area 108 and a second area 110. FIG. 2 does not depict the diffusion of the emitter region 106 that would occur during fabrication. For example, in practice some of the emitter region 106 would diffuse underneath the gate oxide 114. In practice, the union of the first area 108 and the second area 110 is somewhat less than the entire area of the emitter region 106, although FIG. 2 does not show this.

In some embodiments, the first area 108 surrounds the second area 110. FIG. 3 shows the first area 108 surrounding the second area 110. FIG. 3 shows the first area 108 and the second area 110 of the emitter region 106 as having rectangular boundaries, but this depiction is a simplification.

Referring to FIG. 2, silicide 202 is formed in the second area 110 of the emitter region 106. Depositing a metal onto the second area 110 of the emitter region 106, and then annealing forms the silicide 202. The metal may comprise tungsten. The silicide 202 provides electrical connection of the emitter region 106 to other circuit components (not shown).

Referring to FIG. 1, a base contact region 112 is formed in the base region 104 to provide ohmic contact to the base region 104. The base contact region 112 may be formed by source-drain implantation. For the example in which the illustrative transistor 100 is a PNP transistor, the base contact region 112 is an N-type semiconductor. For example, donor dopants may be implanted into the base region 104 to form the base contact region 112. For the example in which the illustrative transistor 100 is an NPN transistor, the base contact region 112 is a P-type semiconductor. For example, acceptor dopants may be implanted into the base region 104 to form the base contact region 112.

A gate oxide 114 is formed over the base region 104, illustrated in FIG. 1 and FIG. 2. For some embodiments, the gate oxide 114 may comprise silicon dioxide ($SiO_2$), and is a high-quality oxide thermally grown on the semiconductor upon which the illustrative transistor 100 is fabricated.

Formed over the gate oxide 114 is a gate material 116, illustrated in FIG. 1 and FIG. 2. The gate material 116 may comprise polysilicon, and protects the gate oxide 114 during subsequent processing steps that could damage the gate oxide 114 if the gate material 116 were not present. For some embodiments, the combination of the gate oxide 114 and the gate material 116 surround the emitter region 106. This is illustrated in FIG. 3, showing the gate material 116 surrounding the first area 108 of the emitter region 106. (FIG. 3 does not show the gate oxide 114 because it lies underneath the gate material 116.)

The combination of the gate oxide 114 and the gate material 116 may be described as being disposed between the emitter region 106 and the base contact region 112. Isolating the emitter region 106 from the base contact region 112 with a high quality oxide provided by the gate oxide 114 helps with the 1/f noise and popcorn noise of the illustrative transistor 100 during operation in a circuit, such as an analog amplifier.

Figure 4:
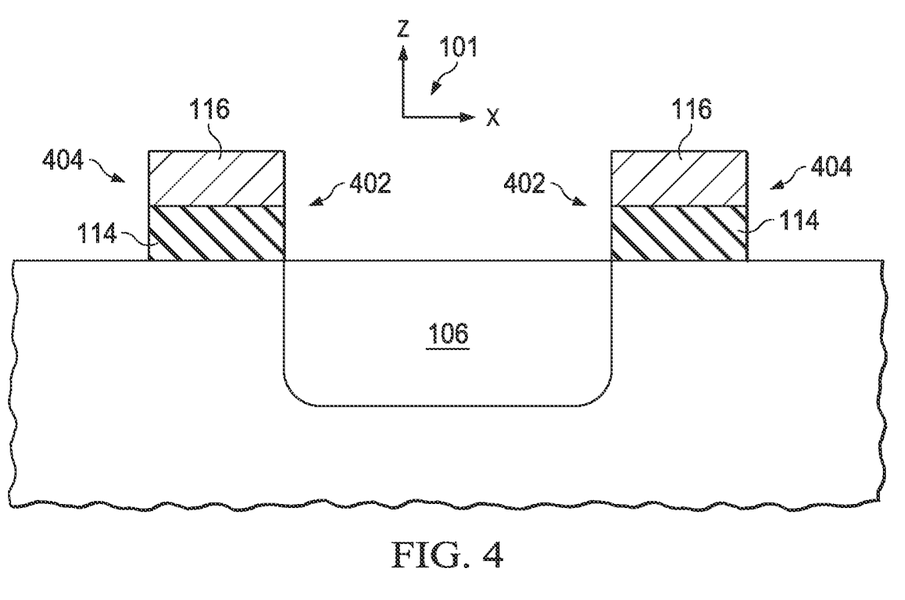
FIG. 4 shows an illustrative transistor in accordance with various examples.

FIG. 4 shows the illustrative transistor 100 according to an embodiment, where several of the components in FIG. 1 are shown in more detail. The gate material 116 and the gate oxide 114 may be described as having a first sidewall 402 and a second sidewall 404. The gate material 116 and the gate oxide 114 can serve as a hard mask when implanting dopants to form the emitter region 106 and the base contact region 112, so that the first sidewall 402 may be viewed as defining a boundary of the emitter region 106 and the second sidewall 404 may be viewed as defining a boundary of the base contact region 112.

Because of diffusion, the previous statement regarding the boundaries of the emitter region 106 and the base region 112 is only approximate, and there is no precise definition to these boundaries, nor are these boundaries exactly aligned with the sidewalls. Nevertheless, for purposes of illustrating the embodiments, FIG. 3 shows a boundary 302 of the emitter region 106 that ideally is aligned with the first sidewall 402, and a boundary 304 of the base contact region 112 that ideally is aligned with the second sidewall 404. The first sidewall 402 may be described as surrounding the first area 108 of the emitter region 106. The boundary 304 of the base contact region 112 may be described as surrounding the second sidewall 404.

Referring to FIG. 1 (or FIG. 2), a silicide block 118 is formed on the first sidewall 402. Referring to FIG. 2, the silicide block 118 covers the first area 108 of the emitter region 106. The silicide block 118 leaves uncovered (or exposed) the second area 110 of the emitter region 106. The silicide block 118 is deposited on the first sidewall 402 before depositing metal to form the silicide 202. When annealing the semiconductor with metal to form the silicide 202, the silicide block 118 prevents silicide from forming on the first sidewall 402. The silicide block 118 is disposed between the silicide 202 and the first sidewall 402.

The silicide block 118 comprises a dielectric, where metal deposited on the silicide block 118 is prevented from forming a silicide with the silicon directly beneath the silicide block 118. For some embodiments, the silicide block 118 comprises silicon dioxide, and is formed by depositing silicon dioxide onto the surface of the semiconductor upon which the illustrative transistor 100 is fabricated. For some embodiments, the silicide block 118 is deposited over the entire surface of the semiconductor upon which the illustrative transistor 100 is fabricated, and is selectively etched away to cover the first sidewall 402 (and other components if desired). For example, anisotropic etching may be performed so that some silicon dioxide remains on the first sidewall 402.

The silicide block 118 restricts formation of the silicide 202 to the second area 110 rather than to the entire area of the emitter region 106, if the silicide block 118 were not present. With the silicide block 118 present before forming the silicide 202, formation of the silicide 202 is kept at a distance from the first sidewall 402, where, for some embodiments, this distance may be from 0.1 microns to 1 microns. Referring to FIG. 1, it may be seen that for a PNP transistor, electrons injected laterally from the base region 104 into the emitter region 106 experience more acceptors on their way to the silicide 202 than if there was silicide over the entire area of the emitter region 106. Acceptors present a potential barrier to electrons, and consequently the silicide block 118 helps mitigate lateral injection of base current to the emitter region 106, thereby increasing transistor beta.

For a PNP transistor, some of the electrons injected vertically from the base region 104 into the emitter region 106 may encounter the silicide block 118, and are expected to be reflected back into the base region 104, thereby further reducing base current and contributing to an increase in transistor beta.

Referring to FIG. 1, dopants are implanted in the collector region 102 to form a first well 120, and dopants are implanted in the first well 120 to form a collector contact region 122. The collector contact region 122 may be formed by source-drain implantation. An STI region 124 is formed between the collector contact region 122 and the base contact region 112 to provide electrical isolation. For a PNP transistor, the first well 120 and the collector contact region 122 are P-type semiconductors. For an NPN transistor, the first well 120 and the collector contact region 122 are N-type semiconductors. A second well 126 may be formed in the collector region 102 between the base contact region 112 and the collector contact region 122 to provide electrical isolation.

Figure 5:
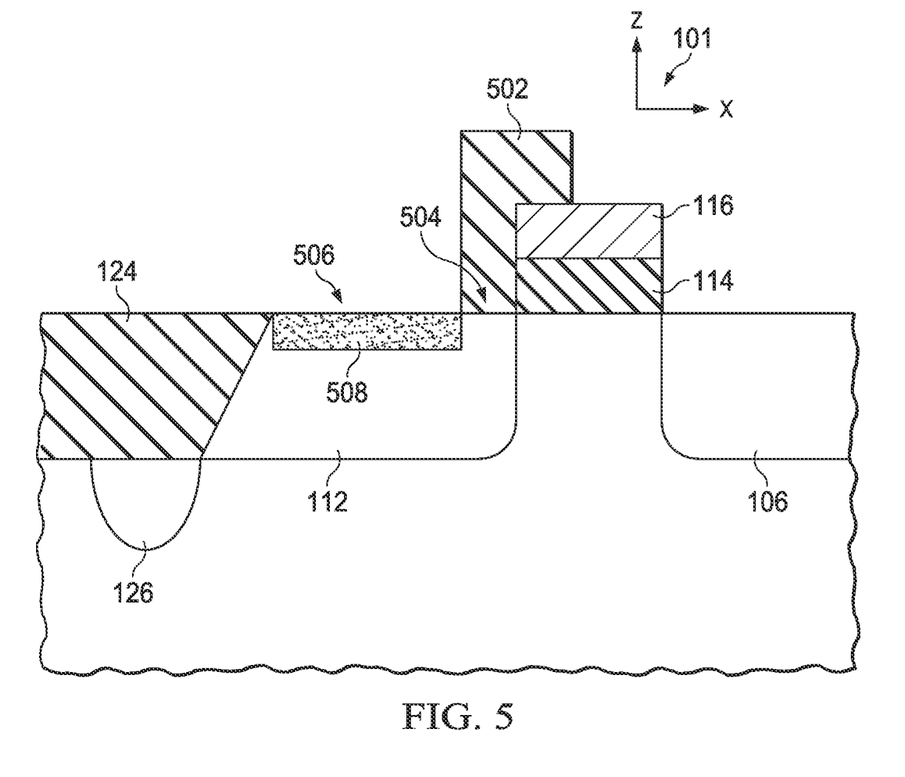
FIG. 5 shows an illustrative transistor in accordance with various examples.

FIG. 5 shows the illustrative transistor 100 according to an embodiment, where several of the components in FIG. 1 are shown in more detail. A silicide block 502 is formed on the second sidewall 404. The silicide block 502 may be formed when the silicide block 118 is formed. For example, silicon dioxide may be deposited over the semiconductor upon which the illustrative transistor 100 is fabricated, and the deposited silicon dioxide is etched back anisotropically to leave silicon dioxide on the sidewalls.

The silicide block 502 covers a first area 504 of the base contact region 112, leaving uncovered (exposed) a second area 506 of the base contact region 112. Depositing metal followed by annealing forms a silicide 508 in the second area 506 of the base contact region 112. (FIG. 1 does not show the silicide 508.) Forming the silicide 508 may be concurrent with forming the silicide 202. The silicide block 502 is deposited on the second sidewall 404 before forming the silicide 508, so that the silicide block 502 prevents silicide from forming in the first area 504 of the base contact region 112, and prevents silicide from forming on the second sidewall 404. The silicide block 502 is disposed between the silicide 508 and the second sidewall 404.

Referring to FIG. 3, the second area 506 of the base contact region 112 surrounds the first area 504 of the base contact region 112. In practice, due to diffusion the union of the first area 504 and the second area 506 is somewhat less than the entire area of the base contact region 112, although for purposes of describing the embodiments, the union of the first area 504 and the second area 506 may be viewed as representing the entire area of the base contact region 112. Accordingly, FIG. 3 shows that the base contact region 112 surrounds the gate material 116. Ideally, the boundary 304 of FIG. 3 is aligned with the second sidewall 404, so that FIG. 3 shows that the first area 504 of the base contact region 112 surrounds the second sidewall 404.

To form the base region 104, dopants are implanted with a first dosage into the collector region 102 to form a base region (not yet the final base region 104), followed by a second implantation of dopants with a second dosage to form the base region 104. The first and second dosages are such that the first implantation is deeper than the second implantation.

In some embodiments, the illustrative transistor 100 is an NPN transistor, where implanting dopants with the first dosage (for a deep implantation) comprises implanting boron at a dose of $5.0*10^{13}$ cm$^{-2}$ with an energy of 140 keV, and implanting dopants with the second dosage (for a shallow implantation) comprises implanting boron at a dose of $4.0*10^{13}$ cm$^{-2}$ with an energy of 20 keV.

Adding the shallow implantation in addition to the deep implantation brings about a higher concentration of dopants (e.g., acceptors for an NPN transistor and donors for a PNP transistor) at the surface between the emitter region 106 and the base contact region 112. As an example of the higher concentration of boron due to the shallow implant, in some embodiments, the concentration of boron at a depth of 0.2 microns is greater than $1.0*10^{16}$ cm$^{-3}$.

The added concentration of dopants near the surface of the emitter region 106 presents a potential barrier to minority carriers in the base region 104, thereby contributing to the beta. For example, for an NPN transistor, electrons injected laterally from the emitter region 106 experience a higher potential barrier because of the shallow implant. Consequently, there are less electrons being absorbed by the base contact region 112, thereby reducing base current and resulting in a higher beta.

Figure 6:
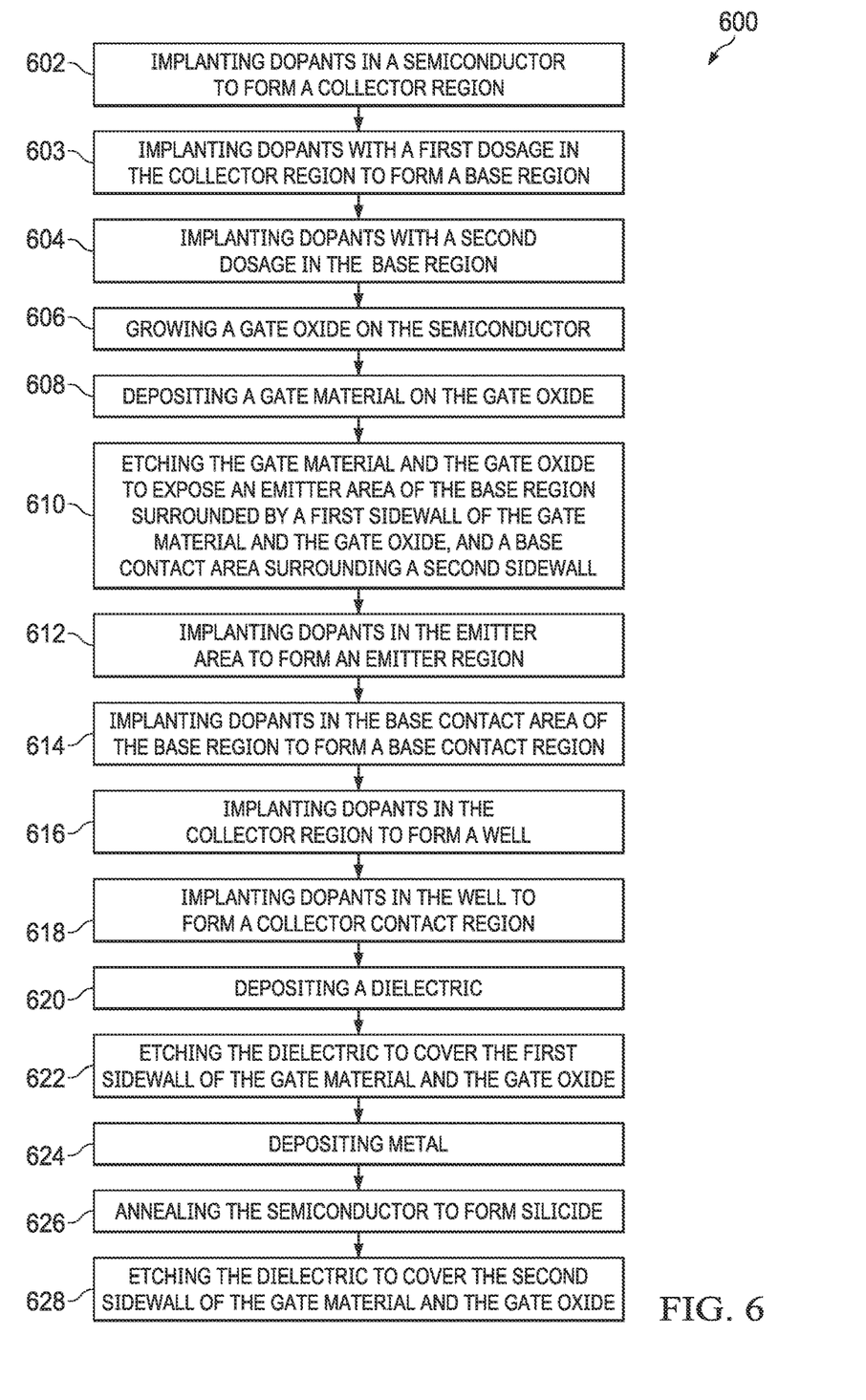
FIG. 6 shows an illustrative transistor fabrication process in accordance with various examples.

FIG. 6 shows an illustrative process 600 for fabricating the illustrative transistor 100 according to an embodiment. In step 602, dopants are implanted in a semiconductor to form a collector region having majority carriers of a first type. In step 603, dopants are implanted with a first dosage in the collector region to form a base region. In step 604, dopants are implanted with a second dosage in the collector region to form the base region having majority carriers of a second type. In step 606, a gate oxide is grown on the semiconductor, and in step 608, a gate material is deposited on the gate oxide.

In step 610, the gate material and the gate oxide are etched to expose an emitter area of the base region, and to expose a base contact area in the base region. The etching of the gate material and the gate oxide forms a first sidewall and a second sidewall. For some embodiments, the first sidewall of the gate material and the gate oxide surround the emitter area. (Other embodiments could be directed to fabricating lateral transistors.) For some embodiments, the base contact area surrounds the second sidewall of the gate material and the gate oxide.

The gate material and the gate oxide after etching can serve as a hard mask for defining the emitter area, as well as defining other areas for implanting dopants. In step 612, dopants are implanted in the emitter area to form an emitter region having majority carriers of the first type. In step 614, dopants are implanted in the base contact area to form a base contact region having majority carriers of the second type.

Steps 616 and 618 form the collector region of the transistor, where in step 616 dopants are implanted in the collector region to form a well having majority carriers of the first type, and in step 618 dopants are implanted in the well to form a collector contact drain region having majority carriers of the first type to make contact with the collector region.

Before implanting dopants, a photoresist film is deposited and exposed with radiation by one or more lithography masks, followed by baking and etching of the photoresist film to define a pattern on the semiconductor for the dopant implantation. However, such steps are not included in FIG. 6.

In step 620, a dielectric is deposited over the semiconductor. For example, silicon dioxide may be deposited by chemical vapor deposition (CVD). This dielectric serves as a silicide block. In step 622, the dielectric is etched to cover the first sidewall of the gate material and the gate oxide. In step 624, metal is deposited over the surface of the semiconductor and the dielectric, followed by annealing in step 626 so that the metal in contact with silicon forms silicide. In step 628, for some embodiments, the dielectric deposited in step 624 may be etched so as to cover the second sidewall of the gate material and the gate oxide.

The listing of steps in FIG. 6 does not necessarily imply a corresponding ordering of the steps when fabricating a transistor according to an embodiment. However, the steps 620 and 622 to deposit and etch dielectric to form a silicide block on the first sidewall is performed before the steps of 624 and 626 to form silicide in the emitter region. Similarly, the steps 620 and 628 to deposit and etch dielectric to form a silicide block on the second sidewall is performed before the steps of 624 and 626 to form silicide in the base contact region.

Furthermore, some embodiments may not include all steps listed in FIG. 6. For example, some embodiments may not include a silicide block, so that steps 620 and 622 need not be performed before step 624.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A transistor comprising:
   a collector region formed over a semiconductor substrate and having majority carriers of a first type, and a collector contact that intersects a top surface of the semiconductor substrate;
   a base region formed over the semiconductor substrate and having majority carriers of a second type, the base region having a dopant concentration greater than $1.0*10^{16}$ cm$^{-3}$ at a depth of 0.2 μm, and a base contact that intersects the top surface of the semiconductor substrate;
   an emitter region having majority carriers of the first type, the emitter region having a first area and a second area, wherein the base contact surrounds the emitter region and the collector contact surrounds the base contact;
   silicide, wherein the silicide is formed in the second area of the emitter region;
   a gate oxide over the base region; and
   a gate material on the gate oxide, the gate material and the gate oxide having a first sidewall, wherein the silicide formed in the second area of the emitter region is separated from the first sidewall by a distance of at least 0.1 microns.

2. The transistor of claim 1, wherein the first area of the emitter region surrounds the second area of the emitter region, and the first sidewall surrounds the first area of the emitter region.

3. The transistor of claim 1, further comprising:
   a base contact region in the base region having majority carriers of the second type;
   wherein the base contact region has a first area and a second area; and
   wherein the silicide is formed in the second area of the base contact region.

4. The transistor of claim 3, wherein the gate material and the gate oxide have a second sidewall, the second area of the base contact region surrounds the first area of the base contact region, and the first area of the base contact region surrounds the second sidewall.

5. The transistor of claim 1, further comprising a silicide block formed on the first sidewall and on the first area of the emitter region.

6. The transistor of claim 1, wherein the majority carriers of the first type are holes and the majority carriers of the second type are electrons.

7. An integrated circuit, comprising:
   a first doped region having a first conductivity type formed in a semiconductor substrate and having a first contact region extending to a top surface of the semiconductor substrate;
   a second doped region having a second opposite conductivity type formed within the first doped region and having a second contact region that extends to the top surface of the semiconductor substrate and is laterally surrounded by the first contact region;
   a third doped region having the first conductivity type formed within and laterally surrounded by the second doped region; and
   a silicided portion of the third doped region spaced apart from the second doped region and laterally surrounded at a surface of the substrate by an unsilicided portion of the third doped region.

8. The integrated circuit of claim 7, further comprising a spacer on the substrate surface between the third doped region and a doped contact to the second doped region, the doped contact having the second conductivity type.

9. The integrated circuit of claim 8, wherein the spacer includes an oxide layer directly on the second doped region and a polysilicon spacer over the oxide layer.

10. The integrated circuit of claim 7, wherein the first and third doped regions are N-type and the second doped region is P-type.

11. The integrated circuit of claim 7, wherein the second doped region has a dopant concentration greater than $1.0*10^{16}$ cm$^{-3}$ at a depth of 0.2 μm below the substrate surface.

12. The integrated circuit of claim 8, further comprising a sidewall dielectric on an interior sidewall of the spacer, the sidewall dielectric spacing apart the silicided portion from the second doped region.

13. A bipolar junction transistor of an integrated circuit, comprising:
   a collector region having majority carriers of first type formed in a semiconductor substrate, the collector region including a collector contact that intersects a top surface of the semiconductor substrate;

a base region having majority carriers of a second opposite type between the collector region and a surface of the substrate, the base region laterally including a base contact that intersects the top surface of the semiconductor substrate and is surrounded by the collector contact;

an emitter region having majority carriers of the first type between the base region and the substrate surface, the emitter region laterally surrounded by the base region and the base contact; and a silicide layer formed in the emitter region and spaced apart from the base region and laterally surrounded at the surface of the substrate by the emitter region.

14. The bipolar junction transistor of claim 13, further comprising a gate dielectric ring on the substrate surface between the emitter region and a doped contact to the base region, the doped contact having majority carriers of the second type.

15. The bipolar junction transistor of claim 14, further comprising a polysilicon spacer ring on the gate dielectric ring.

16. The bipolar junction transistor of claim 14, wherein the emitter and collector regions are P-type and the base region is N-type.

17. The bipolar junction transistor of claim 14, wherein the base region has a dopant concentration greater than $1.0*10^{16}$ cm$^{-3}$ at a depth of 0.2 μm below the substrate surface.

18. The bipolar junction transistor of claim 15, further comprising a sidewall spacer on an interior sidewall of the polysilicon spacer ring, the sidewall spacer spacing apart the silicide layer from the base region.

19. The bipolar junction transistor of claim 15, further comprising a sidewall spacer on an exterior sidewall of the polysilicon spacer ring, the sidewall spacer spacing apart the polysilicon spacer ring from a silicide contact to the base region.

* * * * *